United States Patent [19]

Pelley et al.

[11] Patent Number: 5,040,144

[45] Date of Patent: Aug. 13, 1991

[54] INTEGRATED CIRCUIT WITH IMPROVED POWER SUPPLY DISTRIBUTION

[75] Inventors: Perry Pelley, Austin, Tex.; Tim P. Egging, Colorado Springs, Colo.

[73] Assignee: Motorola, Inc., Schaumburg, Ill.

[21] Appl. No.: 442,268

[22] Filed: Nov. 28, 1989

[51] Int. Cl.$^5$ .................................................. G11C 5/14
[52] U.S. Cl. ......................................... 365/51; 365/63;
365/226; 365/230.03
[58] Field of Search ..................... 365/51, 63, 189.08,
365/230.03, 230.06, 226; 357/45

[56] References Cited

U.S. PATENT DOCUMENTS

| | | | |
|---|---|---|---|
| 4,458,297 | 7/1984 | Stopper et al. ...................... | 357/45 |
| 4,780,846 | 10/1988 | Tanabe et al. ...................... | 365/63 |
| 4,849,943 | 7/1989 | Pennings ............................ | 365/230.06 |

OTHER PUBLICATIONS

"Power Grid Image for Embedded Arrays", IBM Technical Disclosure Bulletin, vol. 32, No. 813 Jan. 1990 pp. 451–452.

Primary Examiner—Stuart N. Hecker
Assistant Examiner—Jack A. Lane
Attorney, Agent, or Firm—Paul J. Polansky

[57] ABSTRACT

An integrated circuit with reduced size through improved power supply distribution. A bonding pad supplies $V_{SS}$ to an integrated circuit memory, which is distributed through a plurality of power supply lines in a first metal layer and a plurality of grid lines in a second metal layer intersecting at right angles. The plurality of grid lines are placed in unused spaced in the second metal layer and are coupled to the power supply lines in the first metal layer. Together the grid lines and the power supply lines provide an improved power supply by lowering the impedance from a point on the integrated circuit to $V_{SS}$ supplied on the bonding pad. While this technique is ideally suited to memory devices because of the repetitive nature of blocks of memory cells, other types of integrated circuits can also utilize such a power supply distribution technique.

8 Claims, 3 Drawing Sheets

INTEGRATED CIRCUIT WITH IMPROVED POWER SUPPLY DISTRIBUTION

FIELD OF THE INVENTION

This invention relates generally to an integrated circuit with improved power supply distribution, and more particularly, to an integrated circuit memory with reduced size through improved power supply distribution.

BACKGROUND OF THE INVENTION

Metal oxide semiconductor (MOS) integrated circuits typically operate from a +5 volt power supply, $V_{DD}$, with a second power supply forming a ground, or $V_{SS}$, supply at 0 volts. In integrated circuit memories, these power supplies are each typically provided on one device pin. Each device pin is wire-bonded to a bonding pad on the integrated circuit itself. Although bond wires and package pins insert a series resistance and inductance between the bonding pad and the external power supply, it is useful to think of the power supply provided on the bonding pad as an ideal voltage source. One or more metal power supply lines are connected to each power supply bonding pad and route the power supply voltages throughout the integrated circuit. As the distance between functional circuitry and the bonding pad increases, the characteristics of the power supply provided to the functional circuitry become less ideal. Connecting to the ideal voltage source via a relatively thin metal line adds series resistance and capacitance between the connection point and the ideal voltage source. For the $V_{SS}$ supply, when the current, $I_{DD}$, is at a peak, the voltage level on the $V_{SS}$ lines the most distant from the bonding pad can rise and cause the functional circuitry to malfunction.

In integrated circuits with only one device pin for a given power supply, a main metal line, typically 0.01 inches wide for a large integrated circuit memory, is used to bus the power supply to all the functional circuitry. Smaller metal lines connect to the main metal line, but the main metal line is the primary conduit for routing a power supply from one side of the integrated circuit to another. The single-pin requirement fixes a maximum length between the bonding pad and the functional circuitry on the opposite end of the integrated circuit for a given size of the main metal line. Conversely, for a given length from the farthest functional circuitry to the bonding pad, the main metal line must be at least a given width to provide a power supply adequate to ensure proper operation.

Resistance through a conductor can be determined by the following formula:

$$R = (\rho * L)/W$$

where $\rho$ is the resistivity of the conductor, W is the width of the conductor, and L is the length of the conductor. Because of this basic relation, and since $\rho$ and L are fixed, the width W of the metal conduit determines whether the resistance R is low enough to prevent incorrect operation during times of peak current. A technique used in the prior art has been to increase W until R becomes low enough to ensure correct operation. A problem with this approach, however, is that W must be so large, 0.01 inches typically, that the size of the integrated circuit increases substantially due to the width of the main power bus lines. The tradeoff between W and integrated circuit size also results in a power supply that is barely good enough to avoid malfunction.

BRIEF DESCRIPTION OF THE INVENTION

Accordingly, it is an object of the present invention to provide an integrated circuit device with decreased size through improved power supply distribution.

It is another object of the present invention to provide an integrated circuit memory with with improved power supply distribution.

In carrying out these and other objects of the invention, there is provided, in one form, an integrated circuit with functional circuitry therein. The integrated circuit comprises a bonding pad, a plurality of horizontal lines, and a plurality of vertical lines. The bonding pad is for being coupled to a power supply voltage terminal. The plurality of horizontal lines are coupled to coupled to the bonding pad and to the functional circuitry. The plurality of vertical lines are coupled to the plurality of horizontal lines and intersect the horizontal lines at right angles. The plurality of horizontal lines and the plurality of vertical lines together couple the power supply voltage terminal to the functional circuitry.

These and other objects, features and advantages will be more clearly understood from the following detailed description taken in conjunction with the accompanying drawings.

DETAILED DESCRIPTION OF THE INVENTION

Figure 1:
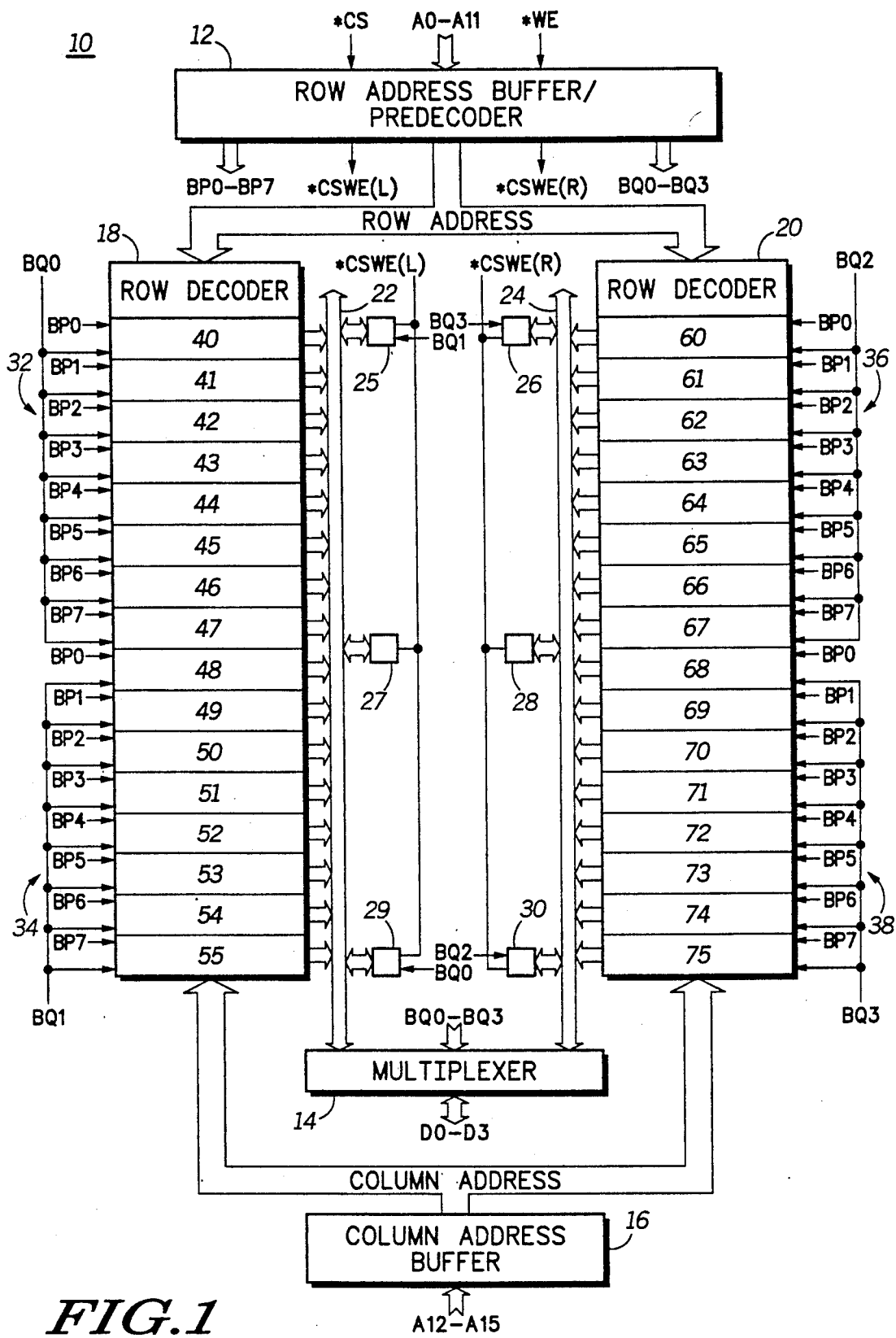
FIG. 1 is a block diagram of an integrated circuit memory.

Shown in the FIG. 1 is a memory 10 generally comprising a row address buffer/predecoder 12, a multiplexer 14, a column address buffer 16, a first row decoder 18, a second row decoder 20, a first set of global data lines 22, a second set of global data lines 24, global data line load sets 25,26,27, 28,29, and 30, a first array 32, a second array 34, a third array 36, and a fourth array 38. First set of global data lines 22 comprises four global data line pairs, each pair including a true global data line and a complementary global data line. Second set of global data lines 24 comprises four global data line pairs, each pair including a true global data line and a complementary global data line. First array 32 comprises memory blocks 40,41,42,43,44,45,46, and 47. Second array 34 comprises memory blocks 48,49,50,51,52,53,54, and 55. Third array 36 comprises memory blocks 60,61,62,63,64,65,66, and 67. Fourth array 38 comprises memory blocks 68,69,70,71,72,73,74, and 75.

Row address buffer/predecoder 12 receives row address signals A0, A1, A2,A3,A4,A5,A6,A7,A8,A9,A10, and A11, chip select signal *CS, and write mode signal *WE. Row address buffer/predecoder 12 provides memory block select signals BP0,BP1,BP2,BP3,BP4,BP5,BP6, and BP7, chip select/write signals *CSWE(L) and *CSWE(R), array select signals BQ0,BQ1,BQ2, and BQ3, and a buffered row address signal. An asterisk (*) in front of a signal designation indicates that signal is active at a logic low. Column address buffer 16 receives column address signals A12,A13,A14, and A15, and outputs a buffered column address. Multiplexer 14 receives signals BQ0-BQ3 and is coupled to sets of global data lines 22 and 24. In a read mode of memory 10, multiplexer 14 receives global data line signals GDL(0) and *GDL(0), GDL(1) and *GDL(1),GDL(2) and *GDL(2), and GDL(3) and *GDL(3) from first set of global data lines 22, and global data line signals GDL(4) and *GDL(4), GDL(5) and *GDL(5),GDL(6) and *GDL(6), and GDL(7) and *GDL(7) from second set of global data lines 24. Multiplexer 14 outputs data signals D0,D1,D2, and D3 in the read mode, and receives data input signals D0-D3 in a write mode of memory 10. First row decoder 18 receives the buffered row address and selectively provides 64 global word line driver signals and a buffered row address signal to memory blocks 40-55. Second row decoder 20 receives the buffered row address and selectively provides 64 global word line driver signals and a buffered row address signal to memory blocks 60-75.

Array 32 is located immediately above array 34, and to the left of arrays 36 and 38. Memory blocks within array 32 are placed sequentially below one another, with memory block 40 at the top of array 32, memory block 41 below memory block 40, etc. Memory block 47 is at the bottom of array 32. Memory blocks within array 34 are placed sequentially below one another, with memory block 48 at the top of array 34, memory block 49 below memory block 48, etc. Memory block 55 is at the bottom of array 34. Array 36 is located immediately above array 38. Memory blocks within array 36 are placed sequentially below one another, with memory block 60 at the top of array 36, memory block 61 below memory block 60, etc. Memory block 67 is at the bottom of array 36. Memory blocks within array 38 are placed sequentially below one another, with memory block 68 at the top of array 38, memory block 69 below memory block 68, etc. Memory block 75 is at the bottom of array 38. First set of global data lines 22 begins at the top of array 32 and runs below the bottom of array 34, where it connects with multiplexer 14. Second set of global data lines 24 begins at the top of array 36 and runs below the bottom of array 38, where it connects with multiplexer 14.

Global data line load set 25 connects to first set of global data lines 22 at the top of array 32. Below global data line load set 25 memory blocks 40-47 in first array 32 connect to first set of global data lines 22. Below first array 32 global data line load set 27 connects to first set of global data lines 22. Below global data line load set 27 memory blocks 48-55 in second array 34 connect to first set of global data lines 22. Below second array 34 global data line load set 29 connects to first set of global data lines 22. Multiplexer 14 connects to the first set of global data lines 22. In the read mode, multiplexer 14 receives signals GDL(0)/*GDL(0)-GDL(3)/*GDL(3) on the four global data line pairs contained in first set of global data lines 22.

Global data line load set 26 connects to the second set of global data lines 24 at the top of array 36. Below global data line load set 26 memory blocks 60-67 in third array 36 connect to second set of global data lines 24. Below third array 36 global data line load set 28 connects to second set of global data lines 24. Below global data line load set 28 memory blocks 68-75 in fourth array 38 connect to the second set of global data lines 24. Below fourth array 38 global data line load set 30 connects to the second set of global data lines 24. Multiplexer 14 connects to second set of global data lines 24. In the read mode, multiplexer 14 receives signals GDL(4)/*GDL(4)-GDL(7)/*GDL(7) on the four global data line pairs contained in second set of global data lines 24.

Global data line load set 25 receives array select signal BQ1 and chip select/write signal *CSWE(L). Global data line load set 27 receives chip select/write signal *CSWE(L). Global data line load set 29 receives array select signal BQ0 and chip select/write signal *CSWE(L). Global data line load set 26 receives array select signal BQ3 and chip select/write signal *CSWE(R). Global data line load set 28 receives chip select/write signal *CSWE(R). Global data line load set 30 receives array select signal BQ2 and chip select/write signal *CSWE(R).

Array 32 is selected when signal BQ0 is a logic high. One of memory blocks 40-47 is selected when array 32 is selected. The particular memory block 40-47 within array 32 which is selected when its corresponding signal of signals BP0-BP7 is a logic high. In array 32, memory blocks 40-47 connect to first row decoder 18 and to column address buffer 16. Memory blocks 40-47 receive memory block select signals BP0-BP7, respectively. Each of memory blocks 40-47 receives array select signal BQ0 from row address buffer/decoder 12, and has four data output pairs coupled to first set of global data lines 22. In the read mode, a selected memory block provides output signals onto first set of global data lines 22 via the four data output pairs coupled between the selected memory block and first set of global data lines 22. Similarly, in the write mode, multiplexer 14 outputs signals onto the first set of global data lines 22 and the selected memory block reads these signals.

Array 34 is selected when signal BQ1 is a logic high. One of memory blocks 48-55 is selected when array 34 is selected. The particular memory block 48-55 within array 34 which is selected is selected when its corresponding signal of signals BP0-BP7 is a logic high. In array 34, memory blocks 48-55 connect to first row decoder 18 and to column address buffer 16. Memory blocks 48-55 receive memory block select signals BP0-BP7, respectively. Each of memory blocks 48-55 receives array select signal BQ1 from row address buffer/decoder 12, and has four data output pairs coupled to first set of global data lines 22. In the read mode, a selected memory block provides output signals onto first set of global data lines 22 via the four data output pairs coupled between the selected memory block and first set of global data lines 22. Similarly, in the write mode, multiplexer 14 outputs signals onto the first set of global data lines 22 and the selected memory block reads these signals.

Array 36 is selected when signal BQ2 is a logic high. One of memory blocks 60-67 is selected when array 36 is selected. The particular memory block 60-67 within array 36 which is selected is selected when its corresponding signal of signals BP0-BP7 is a logic high. In array 36, memory blocks 60-67 connect to second row decoder 20 and to column address buffer 16. Memory blocks 60-67 receive memory block select signals BP0-BP7, respectively. Each of memory blocks 60-67 receives array select signal BQ2 from row address buffer/decoder 12, and has four data output pairs coupled to second set of global data lines 24. In the read mode, a selected memory block provides output signals onto second set of global data lines 24 via the four data output pairs coupled between the selected memory block and second set of global data lines 24. Similarly, in the write mode, multiplexer 14 outputs signals onto the second set of global data lines 24 and the selected memory block reads these signals.

Array 38 is selected when signal BQ3 is a logic high. One of memory blocks 68–75 is selected when array 38 is selected. The particular memory block 68–75 within array 38 which is selected is selected when its corresponding signal of signals BP0–BP7 is a logic high. In array 38, memory blocks 68–75 connect to second row decoder 20 and to column address buffer 16. Memory blocks 68–75 receive memory block select signals BP0–BP7, respectively. Each of memory blocks 68–75 receives array select signal BQ3 from row address buffer/decoder 12, and has four data output pairs coupled to second set of global data lines 24. In the read mode, a selected memory block provides output signals onto second set of global data lines 24 via the four data output pairs coupled between the selected memory block and second set of global data lines 24. Similarly, in the write mode, multiplexer 14 outputs signals onto the second set of global data lines 24 and the selected memory block reads these signals.

In operation, memory 10 allows memory cells located within memory blocks 40–55 and 60–75 to be read from and written to. During write cycles, multiplexer 14 receives data signals D0–D3 and supplies them to the appropriate memory block based on the address A0–A15. In a write mode, when a memory block on a left side of memory 10 comprising blocks in arrays 32 or 34 is being written to, *CSWE(L) is low and global data line load sets 25, 27, and 29 are disabled. Global data line load sets 26, 28, and 30 are enabled, however, to prevent the second set of global data lines from assuming an indeterminate state. When a memory block on a right side of memory 10 is being written to, *CSWE(R) is low and global data line load sets 26, 28, and 30 are disabled. Global data line load sets 25, 27, and 29 are enabled, however, to prevent the first set of global data lines from assuming an indeterminate state.

In the read mode, memory 10 provides four bits of data represented by data signals D0–D3 selected by address signals A0–A15. Column address buffer 16 buffers incoming address signals A12–A15 and outputs them to memory blocks 40–55 and 60–75. Row address buffer/predecoder 12 decodes row address lines A0–A11, chip select signal *CS, and write mode signal *WE. In response, it supplies signals BP0–BP7, BQ0–BQ3, *CSWE(L) and *CSWE(R), and a row address to row decoders 18 and 20. Signals BP0–BP7 select one of eight memory blocks of each array 32, 34, 36, and 38. Signals BQ0–BQ3 select which one of the four arrays 32, 34, 36, and 38 is selected. Together, signals BP0–BP7 and signals BQ0–BQ3 select one memory block of 32 memory blocks of the set 40–55 and 60–75. *CSWE(L) is true if both *CS and *WE are true and a left side comprising arrays 32 and 34 is selected, and indicates that memory 10 is in the write mode, that memory 10 is active, and that the global data line loads connected to first set of global data lines 22 should be disabled. *CSWE(R) is true if both *CS and *WE are true and a right side comprising arrays 36 and 38 is selected, and indicates that memory 10 is in the write mode, that memory 10 is active, and that the global data line loads connected to second set of global data lines 24 should be disabled.

The buffered row address is input to first row decoder 18 and second row decoder 20. In response to receiving the buffered row address, first row decoder 18 drives 64 global word lines to memory blocks 40–55 and second row decoder 20 drives 64 global word lines to memory blocks 60–75. The word lines, along with the column address and the buffered row address signal, are further decoded in the memory blocks themselves. After a particular memory block is selected by BP0–BP7 and BQ0–BQ3, the memory block combines the 64 global word lines and the buffered row address signal and drives 128 local word lines. The memory block decodes the column address along with the selected word line and selects one memory cell for each of four pairs of global data lines. The four memory cells output four data bits and the complements of the four data bits onto the first set of global data lines 22 if the memory block selected is located in either first array 32 or second array 34, or outputs four data bits and the complements of the four data bits onto the second set of global data lines 24 if the memory block selected is located in first array 36 or second array 38. Multiplexer 14 receives signals GDL(0)/*GDL(0)–GDL(3)/*GDL(3) from first set of global data lines 22 and signals GDL(4)/*GDL(4)–GDL(7)/*GDL(7) from second set of global data lines 24 and forms and buffers outputs D0–D3 in response. Multiplexer 14 receives signals BQ0–BQ3 and in response derives D0–D3 from signals GDL(0)/*GDL(0)–GDL(3)/*GDL(3) if a memory block in the first array 32 or second array 34 is selected by BQ0 or BQ1, respectively, or from signals GDL(4)/*GDL(4)–GDL(7)/*GDL(7) if a memory block in the third array 36 or fourth array 38 is selected by BQ2 or BQ3, respectively.

When a read access takes place, a selected memory block outputs signals on four global data line pairs. Each global data line pair appears as a pair of transmission lines. The selected memory block outputs signals on each long transmission line using a differential transconductance amplifier, which receives a sensed differential voltage from a selected memory cell and outputs a differential current in response. The global data line loads source the current and thereby convert the output of the transconductance amplifiers to a voltage, so that the signals GDL(0)/*GDL(0)–GDL(7)/*GDL(7) form eight differential voltage pairs.

The particular global data line load sets selected depends on which array contains a memory block which is selected. If first array 32 or second array 34 is selected during a read access, signal *CSWE(L) is high. During a memory access in which *CSWE(L) is high, global data line load set 27 is always selected. Which one of global data line load set 25 and global data line load set 29 is selected is determined by whether a memory block in first array 32 or second array 34 is selected. If a memory block in first array 32 is selected, BQ0 is high, BQ1–BQ3 are low, global data line load set 25 is enabled, and global data line load set 29 is disabled. If a memory block in second array 34 is selected, BQ1 is high, BQ0 and BQ2–BQ3 are low, global data line load set 29 is enabled, and global data line load set 25 is disabled.

Similarly, if third array 36 or fourth array 38 is selected during a read access, signal *CSWE(R) is high. During a memory access in which *CSWE(R) is high, global data line load set 28 is always selected. Which of global data line load set 26 and global data line load set 30 is selected is determined by whether a memory block in third array 36 or fourth array 38 is selected. If a memory block in third array 36 is selected, BQ2 is high, BQ0, BQ1, and BQ3 are low, global data line load set 26 is enabled, and global data line load set 30 is disabled. If a memory block in fourth array 38 is selected, BQ3 is high, BQ0-BQ2 are low, global data line load set 30 is enabled, and global data line load set 26 is disabled.

Figure 2:
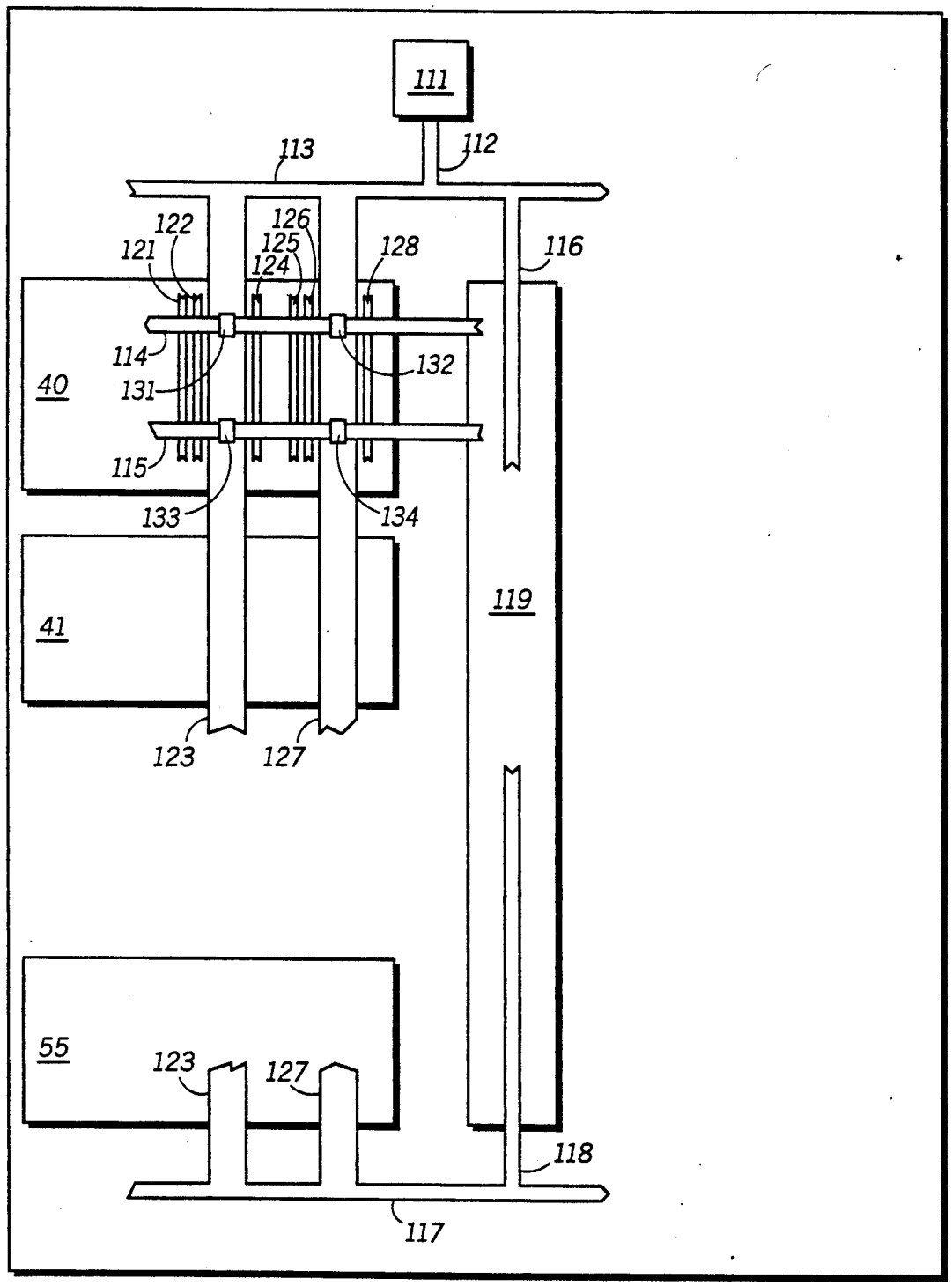
FIG. 2 is a plan view of portions of the integrated circuit memory of FIG. 1 illustrating a preferred embodiment of the present invention.

FIG. 2 shows a plan view of a memory 10' which represents portions of memory 10 of FIG. 1. Memory 10' comprises memory blocks 40, 41, and 55 of FIG. 1, a bonding pad 111, a metal interconnect line 112, a metal power supply bus 113, a metal power supply line 114, a metal power supply line 115, a metal power supply line 116, a metal power supply bus 117, a metal power supply line 118, and a circuit 119. Shown in FIG. 2 are representative portions of memory block 40 useful in understanding the present invention, including a metal local word line 121, a metal global word line 122, a metal grid line 123, a metal local word line 124, a metal local word line 125, a metal global word line 126, a metal grid line 127, a metal local word line 128, a contact 131, a contact 132, a contact 133, and a contact 134. Grid lines 123 and 127 extend through all memory blocks 41-55 on a left half of memory 10', and memory blocks 41 and 55 are included to illustrate the routing. Other memory blocks 42-54, and 60-75 on a right side of memory 10 of FIG. 1 have similar routings of metal lines, but are omitted for ease of illustration.

In memory 10', bonding pad 111 provides an interconnection point for an external negative power supply voltage terminal $V_{SS}$. As earlier indicated, $V_{SS}$ is a ground reference power supply and is approximately 0 volts. Bonding pad 111 couples to the external power supply voltage terminal through a bond wire connecting bonding pad 111 to a point on a lead frame, the lead frame providing an external pin or connection point to couple to the external supply. It is useful to consider $V_{SS}$ supplied on bonding pad 111 as being an ideal voltage source. Power supply bus 113 is coupled to bonding pad 111 through interconnect line 112. Power supply lines 114, 115, and a plurality of power supply lines not shown are coupled to bonding pad 111 via power supply bus 113, and provide $V_{SS}$ to memory block 40 in a horizontal direction. Grid lines 123 and 127 and a plurality of other grid lines not shown, running in a vertical direction, connect to power supply lines like power supply lines 114 and 115. Grid line 123 connects to power supply line 114 through contact 131, and to power supply line 115 through contact 133. Grid line 127 connects to power supply line 114 through contact 132, and to power supply line 115 through contact 134. Collectively, power supply lines 114, 115, and the plurality of horizontal metal lines not shown, along with grid lines 123, 127, and the plurality of grid lines not shown, effectively form a grid for providing $V_{SS}$ to memory block 40. The grid approximates a metal plate, which substantially decreases resistance between a given point and the bonding pad below the resistance provided by a long metal line.

Grid lines 123 and 127 extend downward through memory 10' through all memory blocks on the left half of memory 10'. At the bottom of memory 10', grid lines 123 and 127 connect to power supply bus 117, which provides a power bus for the bottom of memory 10'. Power supply line 116 connects to power supply bus 113 and supplies power to a top half of circuit 119. Power supply line 118 connects to power supply bus 117 and supplies power to a bottom half of circuit 119. Additionally metal lines like power supply lines 114 and 115 also supply power to circuit 119.

In memory 10', a memory cell is located at each intersection of a local word line and a pair of bit lines. The global word lines are routed through each memory block in a given half of memory 10'. For example, global word lines 122 and 126 are routed to each of memory blocks 40-55. Inside the memory blocks, local word lines such as local word lines 121, 124, 125, and 128 are coupled to the global word lines via decoding logic.

Electrically, connecting the plurality of grid lines, of which grid lines 123 and 127 are examples, to the plurality of power supply lines, of which power supply lines 114 and 115 are examples, reduces resistance between a memory cell and the $V_{SS}$ supply, all else equal. The distribution provided by the resulting grid closely approximates a plate, which provides the lowest resistance between two points within a bounded area. In the plate, W is maximized in relation to L, thereby minimizing R. The grid provided by lines 114, 115, 123, 127, and others not shown covers memory block 40. In other memory blocks a plurality of power supply lines and a plurality of grid lines form similar grids. In addition, a plurality of power supply lines in memory block 40 like power supply lines 114 and 115 shown in FIG. 2 connect the grid to other circuits like circuit 119. In this case, circuit 119 also benefits from a lowered resistance to $V_{SS}$. A grid, not shown in FIG. 2, is similarly formed by power supply lines and grid lines on the right half of the memory, and provides an improved power supply to memory blocks 60-75.

Figure 3:
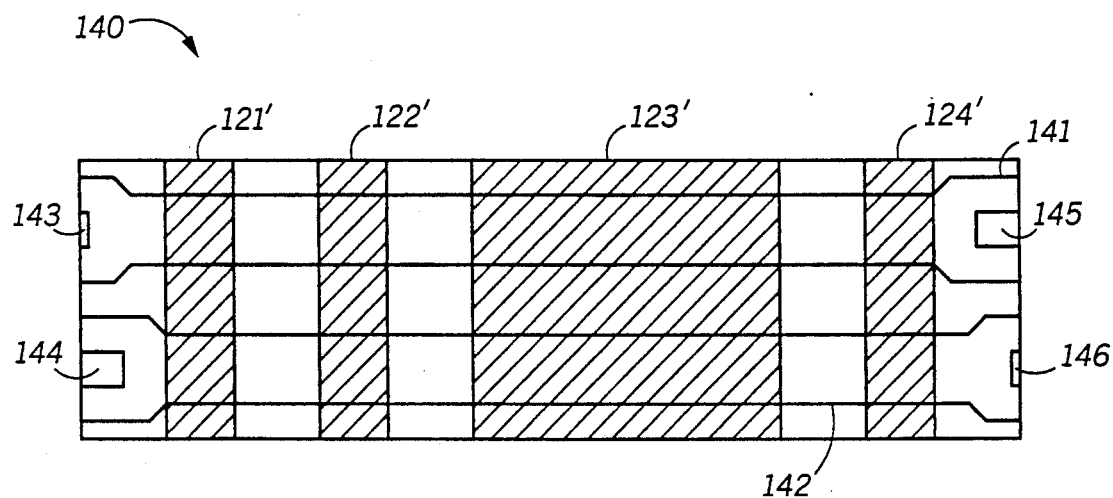
FIG. 3 is a schematic layout of the preferred embodiment of FIG. 2 which forms a repeating structure over a plurality of pairs of memory cells.

FIG. 3 shows in greater detail a layout cell 140 of some of the metal lines of memory block 40 of FIG. 2 over a pair of memory cells, which forms a repeating structure. Layout cell 140 comprises a metal local word line 121', a metal global word line 122', a metal grid line 123', a metal local word line 124', a metal bit line 141, a metal inverted bit line 142, a partial contact 143, a partial contact 144, a partial contact 145, and a partial contact 146. Lines 121', 122', 123', and 124' correspond to lines 121, 122, 123, and 124 of FIG. 2 and constitutes segments thereof, and hence are numbered similarly for convenience.

Underneath layout cell 140 are two memory cells, one on each half of a line running in the vertical direction down the middle of layout cell 140. One memory cell is rotated 180 degrees in reference to another memory cell to preserve a symmetry between the two. Metal lines through layout cell 140 form a regular pattern only every two memory cells in the horizontal direction. Partial contact 143 is part of a contact in an adjoining cell, which in layout cell 140 corresponds to partial contact 145. Partial contact 144 is part of a contact in the adjoining cell, which in layout cell 140 corresponds to partial contact 146. Unlike contacts 131-134 of FIG. 2, contacts formed by partial contacts 143-146 make an electrical connection between a metal layer and an underlying circuitry layer, instead of between two metal layers.

As with corresponding word line 122 in FIG. 2, global word line 122' routes a decoded signal selecting a word or row to each memory block on a given half of memory 10 of FIG. 1. In contrast, local word lines 121' and 124' are actually used to select individual memory cells. It is important to note the symmetry present between the layout cells to understand how the global word lines and the local word lines are used. Every sixteen layout cells in the vertical direction, local word lines 121' and 124' couple to an underlying polysilicon layer. The polysilicon layer further routes the local word line signals into each of the sixteen memory cells. For example, both memory cells in layout cell 140 are coupled to local word lines 121' and 124' by polysilicon lines. In a preferred embodiment, the polysilicon lines for a given sixteen memory cells are connected to the next sixteen memory cells and to the previous sixteen memory cells to lower impedance.

A selected memory cell is located at an intersection of an active word line and an active bit line pair, as determined by row and column decoding, respectively. Bit lines 141 and 142 are used to sense the contents of memory cells which are selected on active rows by word lines. Bit lines 141 and 142 are located in a first metal layer. In contrast, lines 121', 122', 123', and 124' are located in a second metal layer. In the vertical direction after every four pairs of memory cells, grid line 123 connects to a horizontal power supply line, such as power supply line 114 or 115 of FIG. 2, to form the grid. These power supply lines in turn are coupled to underlying memory cells to provide $V_{SS}$, so that the grid lines do not themselves provide $V_{SS}$ to the memory cells. In a preferred embodiment the second metal layer is above the first metal layer, but the order of the layers could be reversed. Grid line 123' is placed in unused space in the second metal layer to allow the grid to be formed without sacrificing space in either layer. As pointed out earlier, use of grid lines like grid line 123' improves power supply distribution so that wide metal $V_{SS}$ bus lines running from the top end of the memory to the bottom end are no longer needed. Instead, power supply bus 113 and power supply bus 117 can be made much narrower. Use of the grid allows a smaller size for the memory, because large, 0.01 inch $V_{SS}$ bus lines are no longer needed to provide a given resistance to the bonding pad.

It should be apparent by now that an integrated circuit memory with reduced size through the use of an improved power supply distribution apparatus has been shown. Although the grid apparatus is well suited for memories because of their repetitive cell structure, it could be used for other types of integrated circuits to provide improved power supply distribution. It should also be apparent that the grid apparatus could also be used for another power supply, such as $V_{DD}$.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A memory having a plurality of subarrays aligned in a first direction, comprising:

a plurality of metal decoding lines crossing the plurality of subarrays in the first direction, said plurality of metal decoding lines formed in a first predetermined layer;

a plurality of metal power supply lines crossing said plurality of subarrays in a second direction, said second direction substantially orthogonal to said first direction, said plurality of metal power supply lines formed in a second predetermined layer different from said first predetermined layer; and a plurality of metal grid lines between said metal decoding lines and intersecting and coupled to said metal power supply lines, said plurality of metal grid lines formed in said first predetermined layer.

2. The memory of claim 1 wherein said plurality of metal decoding lines comprises a plurality of global word lines and a plurality of local word lines.

3. The memory of claim 1 wherein said metal power supply lines and said metal grid lines provide a power supply voltage terminal to the memory.

4. An integrated circuit comprising a plurality of memory blocks, each memory block comprising a plurality of memory cells, comprising:

a bonding pad, for providing an interconnection point to a power supply voltage terminal, said power supply voltage terminal external to the integrated circuit;

a plurality of horizontal lines, coupled to said bonding pad and located within at least one corresponding memory block, and formed in a first layer of the integrated circuit memory, for coupling said power supply voltage terminal to the plurality of memory cells within said at least one corresponding memory block;

a first plurality of vertical lines formed in a second layer different from said first layer of the integrated circuit memory; and a second plurality of vertical lines, crossing and coupled to the plurality of horizontal lines, and located within a corresponding memory block, and formed in said second layer of the integrated circuit memory, for reducing an impedance between the plurality of memory cells and said power supply voltage terminal.

5. The integrated circuit memory of claim 4, wherein said plurality of vertical lines and said plurality of horizontal lines are metal.

6. The integrated circuit memory of claim 4, wherein said power supply voltage terminal is a negative power supply voltage terminal.

7. The memory of claim 1 wherein each subarray further comprises a plurality of layout cells, each layout cell comprising a segment of a corresponding metal decoding line of said plurality of metal decoding lines and a segment of a corresponding grid line of said plurality of grid lines.

8. The memory of claim 7, wherein a predetermined number of layout cells is arranged in the first direction between adjacent power supply lines of said plurality of power supply lines.

* * * * *

UNITED STATES PATENT AND TRADEMARK OFFICE
CERTIFICATE OF CORRECTION

PATENT NO. : 5,040,144

DATED : August 13, 1991

INVENTOR(S) : Perry Pelley et al.

It is certified that error appears in the above-identified patent and that said Letters Patent is hereby corrected as shown below:

Column 10, line 21, after "circuit", replace "comprising" with --memory with--.

Signed and Sealed this

Twenty-third Day of February, 1993

*Attest:*

STEPHEN G. KUNIN

*Attesting Officer*     *Acting Commissioner of Patents and Trademarks*